United States Patent

Revitz et al.

[15] 3,701,931

[45] Oct. 31, 1972

[54] GOLD TANTALUM-NITROGEN HIGH CONDUCTIVITY METALLURGY

[72] Inventors: Martin Revitz, Poughkeepsie; James M. Thompson, Wappingers Falls, both of N.Y.

[73] Assignee: International Business Machines Corporation, Armonk, N.Y.

[22] Filed: May 6, 1971

[21] Appl. No.: 140,891

[52] U.S. Cl.........317/234 R, 317/234 L, 317/234 M, 29/195 S

[51] Int. Cl...............................................H01l 5/00

[58] Field of Search ..............317/234; 29/198, 195 S

[56] References Cited

UNITED STATES PATENTS 3,544,311 12/1970 De Bucs et al...............75/134

FOREIGN PATENTS OR APPLICATIONS 791,343 7/1968 Canada......................317/234

OTHER PUBLICATIONS

IBM Tech. Bulletin, Vol. 12, No. 10, Mar. 1970

*Primary Examiner*—John W. Huckert
*Assistant Examiner*—E. Wojciechowicz
*Attorney*—Hanifin and Jancin and David M. Bunnell

[57] ABSTRACT

A high conductivity metallurgy interconnection system for semiconductor devices is formed of laminar stripes having a film of gold disposed between films of tantalum-nitrogen.

5 Claims, 5 Drawing Figures

INVENTORS
MARTIN REVITZ
JAMES M. THOMPSON

BY David M. Bunnell
ATTORNEY

GOLD TANTALUM-NITROGEN HIGH CONDUCTIVITY METALLURGY

BACKGROUND OF THE INVENTION

This invention relates generally to integrated circuit devices and more specifically to a high conductivity metallurgy interconnection system for semiconductor devices.

The progressive miniaturization of semiconductor devices has resulted in a need for increasingly compact and efficient high conductivity interconnecting metallurgy systems. Such a system is described, for example, in copending U. S. application, Ser. No. 8618, filed Feb. 2, 1970, entitled "Composite Metallurgy Stripe for Semiconductor Devices" by J. Riseman and P. Totta. This system has films of tantalum surrounding a gold conductor stripe. The main purpose of the tantalum is to provide the necessary adhesion for the gold to the insulating layers. One problem associated with this type of metallurgy system is the tendency of the gold and tantalum to alloy at processing temperatures which causes the electrical resistance of the gold layer to increase. An improved system has been found to be the deposition of Beta tantalum by DC sputtering as is described in copending U. S. application, Ser. No. 889,203 filed Dec. 30, 1969 now U.S. Pat. No. 889,203 entitled "Semiconductor Device Having Gold Adhered to an Electrically Insulating Layer on a Substrate and Method of Adhering Gold". Although the use of Beta tantalum solves the problem of gold tantalum alloying, it has been found that some alloying of the silicon semiconductor material and gold occurs at the contact points even when Beta tantalum is employed. It has been found that the lower tantalum layer can be made more effective as a barrier by exposure to air to form a thin oxide layer prior to gold depositions. We have now found a high conductivity metallurgy system and process for its preparation which is not only effective to form an adherent gold conductivity stripe and substantially prevent tantalum gold alloying but which also provides at the same time an extremely effective barrier against gold silicon alloying without the need for oxidation or other treatment of the tantalum layer.

BRIEF DESCRIPTION OF THE INVENTION

In accordance with this invention there is provided a method of forming an adherent electrical interconnection system for a semiconductor device comprising depositing a layer of tantalum-nitrogen onto the device and forming a layer of gold on top of the tantalum-nitrogen layer.

An improved electrical interconnection system is provided for a semiconductor device which comprises a layer of gold coated on at least one side with a layer of tantalum-nitrogen.

DETAILED DESCRIPTION

Figure 1:
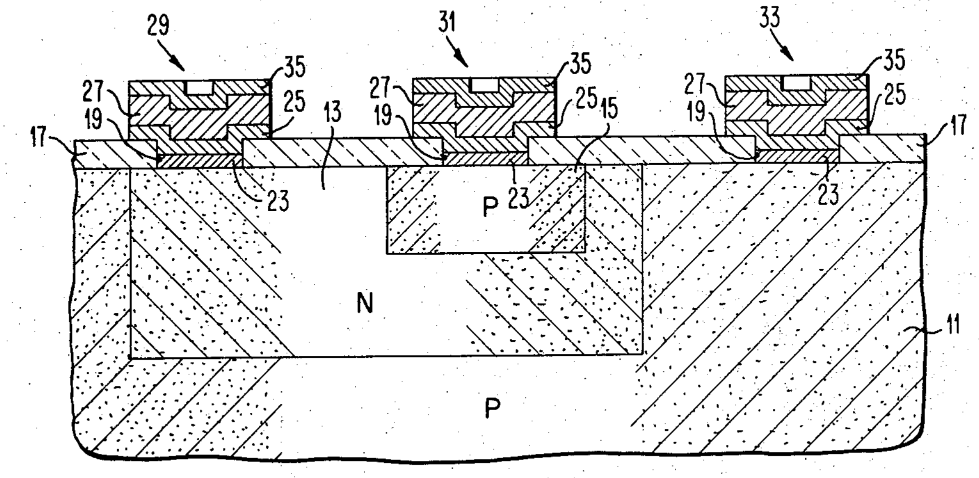
FIG. 1 is a sectional view of a portion of a semiconductor device having a high conductivity gold tantalum-nitrogen electrical interconnection system adhered thereto by the method of the present invention.
Figure 2:
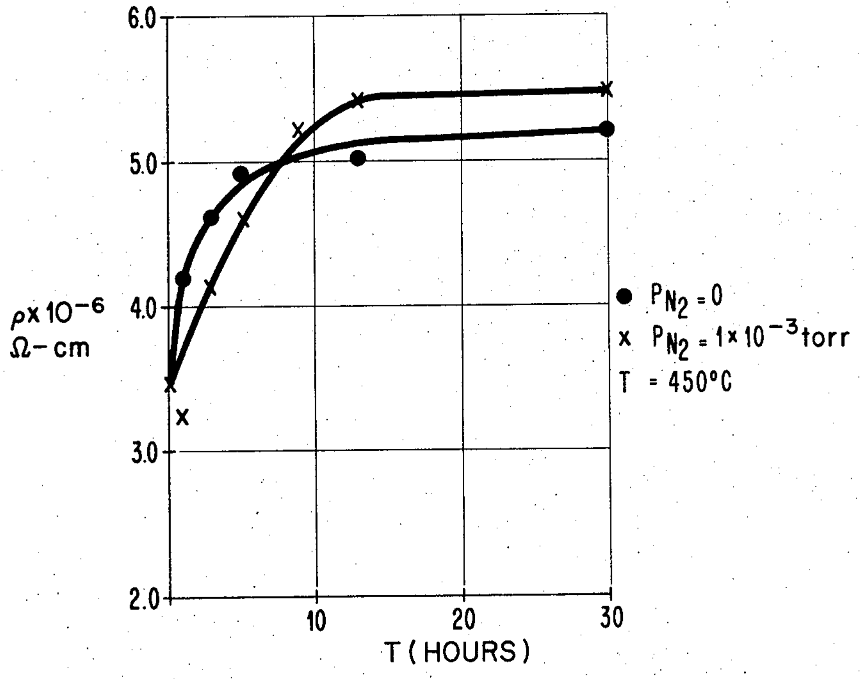
FIG. 2 is a graph showing the change in resistance with respect to time of a gold Beta tantalum conductor stripe compared with a gold tantalum-nitrogen conductor stripe prepared at a nitrogen pressure of $1 \times 10^{-3}$ torr.
Figure 3:
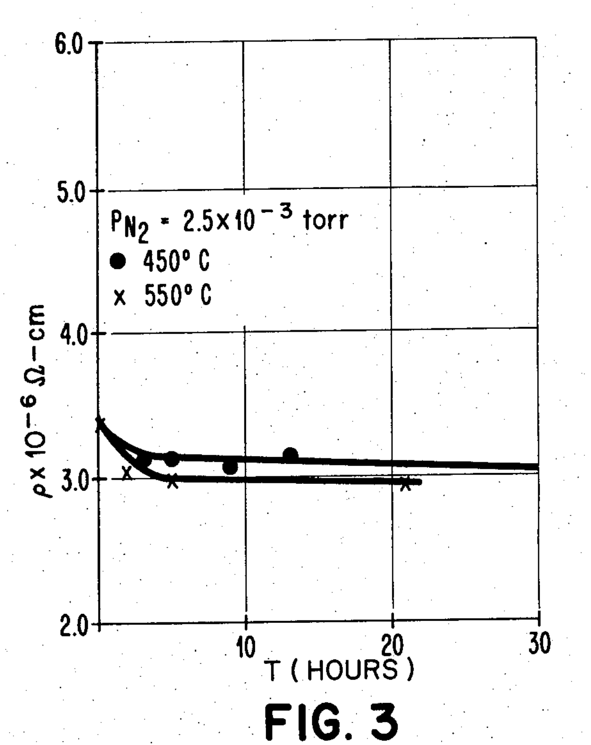
FIGS. 3–5 are graphs showing the change in resistance versus time at elevated temperatures of gold tantalum-nitrogen conductor stripes formed in accordance with the invention at nitrogen pressures of $2.5 \times 10^{-3}$, $5 \times 10^{-3}$, and $20 \times 10^{-3}$ torr respectively.
Figure 4:
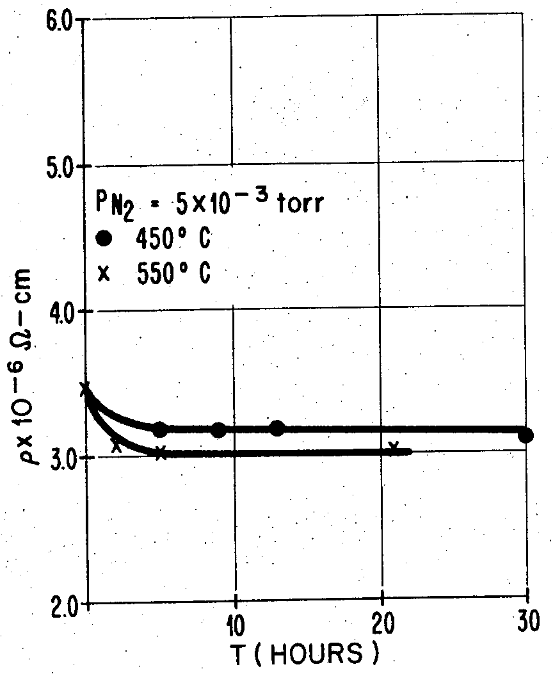
Figure 5:
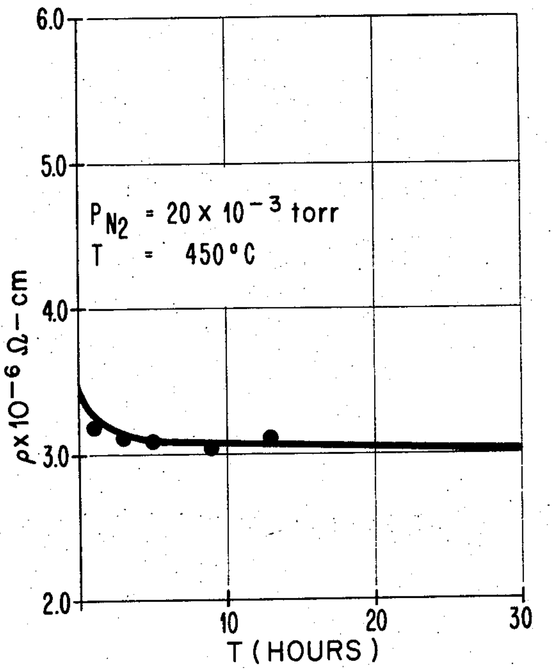

Turning now to FIG. 1 a first level metallurgy system is shown in cross section. A substrate 11 of semiconductor material such as silicon of P type conductivity contains an N region 13 formed in the substrate 11 by, for example, diffusion in the well known manner through an opening in a layer (not shown) of silicon dioxide. The substrate 11 can function as the collector of the transistor and the region 13 functions as the base of the transistor. A P region 15 is formed in the region 13 by diffusion, for example, in the well known manner through an opening in a layer (not shown) of silicon dioxide. The region 15 can function as the emitter of the transistor. When the diffused regions have been formed, an insulating layer 17 of, for example, silicon dioxide or silicon nitride is formed on the surface of the substrate 11 by conventional procedures well known in the art. Openings 19 are formed in the layer 17 to form contact points with substrate 11 and regions 13 and 15. Platinum-silicide contacts 23 are formed on the silicon surface in the openings 19 through the insulating layer. A layer 25 of tantalum-nitrogen is then deposited over the insulating layer 17 and contacts 23. The tantalum-nitrogen layer is preferably deposited by reactive D.C. bias sputtering of tantalum in a nitrogen atmosphere. A film of gold 27 is then deposited on the layer 25 of tantalum-nitrogen preferably by DC sputtering within the same sputtering chamber. Conductor stripes 29, 31 and 33 are then formed as distinct stripes by etching the gold and tantalum-nitrogen layers in a conventional manner. A second layer 35 of tantalum-nitrogen can also be formed in a manner similar to layer 25 on top of the gold conductor stripes to provide adherence and barrier characteristics, where necessary, for the top of the gold stripe. It should be understood that layer 35 can also be formed of pure $\beta$ tantalum where adherence to an overlayer is desired, for example, a second insulating layer where multi-layer electrical connection systems are employed, but where the barrier properties of tantalum-nitrogen are not required.

The depositions of the gold and tantalum-nitrogen are conveniently carried out by reactive bias sputtering using a DC sputtering apparatus in a low pressure gas ionization chamber as is known in the art.

The particular apparatus used for the depositions in the following examples has three water-cooled cathodes which can be used individually to deposit different materials without need to change the cathode or remove the substrates from the chamber. The substrate holder is capable of rotation during depositions and has a cooling channel for rapid cooling of the substrates after the deposition is completed. Quartz iodized lamps are employed to heat the substrate. The tantalum-nitrogen depositions were carried out with the substrate holder stationary and the gold was deposited with the holder rotating. Vertical shields isolate the three cathodes and movable shutters between the cathode and substrate holder allow presputtering for gettering or cathode clean-up just prior to deposition. The substrate holder is isolated electrically and is connected to a regulated DC power supply which supplies bias voltage to the substrate holder. Water cooled tantalum and gold cathodes of 99.99 per cent and 99.999 per cent purity respectively were used for the depositions. A liquid nitrogen trapped oil diffusion pump provides a vacuum of up to $2 \times 10^{-7}$ torr before deposition and $5 \times 10^{-8}$ torr after deposition.

The tantalum-nitrogen depositions are carried out by reducing the pressure to about $5 \times 10^{-6}$ torr and then admitting nitrogen (99.9 percent purity) into the chamber to the desired doping level. Doping levels of at least about $2.5 \times 10^{-3}$ torr are found to give tantalum nitrogen with adequate barrier properties to avoid gold-silicon alloying. An optimum nitrogen partial pressure is about $5 \times 10^{-3}$ torr which gives a tantalum-nitrogen film containing approximately 33 atomic per cent of nitrogen. Although higher nitrogen pressures, for example $20 \times 10^{-3}$ torr, can be employed to provide films containing about 50 atomic per cent nitrogen, the higher pressures are not necessary to provide the barrier characteristics. Structural analysis of deposited tantalum-nitrogen layers formed in an atmosphere containing about $5 \times 10^{-3}$ torr of nitrogen show a close packed crystalline structure which is believed to account for the superior barrier properties.

After the chosen nitrogen pressure is established, argon is admitted to bring the chamber pressure to about 70 microns and a 10 minute tantalum presputter at 2.5 KV and about 50 ma is conducted with the shutter closed and the substrate holder rotating. The heater maintains a temperature of 250° C. The substrate holder is stopped over the tantalum target. Tantalum-nitrogen deposition at the rate of about 7 Angstroms/sec. is then commenced with the substrate at a temperature of about 250° C. at −100 volts bias and the heater off. The cathode current voltage is set at 2 KV and the pressure adjusted (65–75$\mu$) to produce a current of about 300 ma. The wafer temperatures approach 500° C. during the deposition.

After the deposition of the desired film thickness (for example about 1,000 to 2,000 Angstroms) is completed, the nitrogen is removed and in a pure argon atmosphere of about $80 \times 10^{-3}$ torr, gold is presputtered for 10 minutes with the shutter closed and the heater on to bring the substrate to 250° C. A relatively thicker gold conductive layer is then deposited at a rate of about 11 Angstroms per second with the substrate holder rotating at about 35 rpm and a bias voltage of −100 volts. The cathode voltage was set at about 2 KV with the pressure adjusted to about 80 microns so that a current of about 400 ma is produced. A gold layer, for example, about 7,000 Angstroms thick is produced in about 11 minutes. The wafer temperature does not exceed 250° C during deposition.

A second layer of tantalum-nitrogen can then be deposited as before. For the top layer, if only adhesion is required, then pure Beta tantalum can be deposited. A tantalum-nitrogen overlayer can be used in terminal metallurgy where protection of the gold from lead alloying may be required during the reflow of the solder in chip bonding.

The foregoing and other objects, features and advantages of the invention will be apparent from the following more particular description and examples.

EXAMPLE 1

Gold Diffusion Barrier

In order to test the effectiveness of the tantalum-nitrogen barrier layer in preventing a reaction of gold and silicon when the 370° C. eutectic temperature is exceeded, transistors having a structure similar to that illustrated in FIG. 1 were metalized with tantalum-nitrogen gold using the reactive D.C. bias sputtering process described above. The tantalum-nitrogen was deposited at different nitrogen partial pressures (Samples A-K). After the deposition, the transistors were treated at 450° C in a furnace with a reducing atmosphere of hydrogen and nitrogen for periods up to 30 hours. The samples were then examined by means of a light microscope. Where the gold had diffused through the tantalum-nitrogen and alloyed with the silicon, a discolored alloyed appearance was readily detectable. The condition of the devices at different times during the heat treatment is recorded in Table I below. The tantalum-nitrogen layer was deposited at 2 KV, 300 ma — (−100 V) bias and an initial substrate temperature of 250° C, with the nitrogen partial pressure being varied from sample to sample from 0 to $20 \times 10^{-3}$ torr. The wafer sections tested contain typically 100 to 200 transistors.

TABLE I

Transistors Metallized with Tantalum-Nitrogen Gold (6000–7000A and Inspected by Microscope For Alloying After Heat Treatment

| Sample Identity | Ta-N Film Thickness | Nitrogen Pressure/ Torr | Device Condition After Heat Treatment at 450°C Forming Gas |
|---|---|---|---|
| A | 1290A | O | After 1 hour all devices were alloyed. |
| B | 1095A | $5\times10^{-4}$ | After 1 hour all devices were alloyed. |
| C | 1260A | $1\times10^{-3}$ | After 13 hours no alloying. After 30 hours about 5% were alloyed. |
| D | 1145A | $1\times10^{-3}$ | After 9 hours about 90% were alloyed. |
| E | 1025A | $2.5\times10^{-3}$ | After 30 hours none alloyed. |
| F | 1325A | $5\times10^{-3}$ | After 30 hours none alloyed. |
| G | 1005A | $5\times10^{-3}$ | After 30 hours none alloyed. |
| H | 1285A | $7.5\times10^{-3}$ | After 30 hours none alloyed. |
| I | 980A | $10\times10^{-3}$ | After 30 hours none alloyed. |
| J | 980A | $15\times10^{-3}$ | After 30 hours none alloyed. |
| K | 1000A | $20\times10^{-3}$ | After 30 hours none alloyed. |

As shown in Table I, depositions made at $2.5 \times 10^{-3}$ torr nitrogen or greater survived the test without visible alloy failure after 30 hours. Based on the results of this test a nitrogen level of about $5 \times 10^{-3}$ torr is chosen as an optimum deposition condition to provide a safe margin for barrier effectiveness in overcoming any run to run process variation. The electrical properties of the devices having tantalum-nitrogen barrier layers formed with nitrogen pressures of $5 \times 10^{-3}$ torr and above were tested. After heating at 450° C for up to 12 hours in a reducing gas atmosphere no adverse effects of the heating on electrical properties could be detected.

EXAMPLE 2

Gold Conductivity Stability

The tantalum-nitrogen not only prevents a gold-silicon alloying reaction but also is effective to prevent the interaction of tantalum with gold which would result in the degrading of the gold conductivity. FIGS. 2, 3, 4 and 5 are curves of gold resistivity as a function of time and temperature. Gold (6,000 to 7,000 Angstroms), tantalum-nitrogen composite films were deposited as described above on thermal silicon dioxide wafers with a nitrogen pressure varied from 0 to 20 $\times 10^{-3}$ torr. Certain samples were heat treated at 450° C. in forming gas for 30 hours. Other samples were heat treated for 21 hours at 550° C. The samples were periodically withdrawn from the furnace and their resistance measured with a four point system probe according to conventional procedures known in the art. It can be seen from FIG. 2 that a significant degradation of the gold conductivity occurred for those samples deposited at a zero nitrogen pressure and at a nitrogen pressure of $1 \times 10^{-3}$ torr. It can also be seen from FIGS. 3 to 5 that for those films deposited at a nitrogen pressure of $2.5 \times 10^{-3}$ torr or greater, the gold conductivity actually improved with the heat treatment which improvement was more rapid at temperatures of 550° C. A gold discoloration was also visible to the naked eye for those samples deposited with insufficient nitrogen pressure.

The foregoing has described a high conductivity metallurgy system for semiconductor devices using a tantalum-nitrogen barrier layer. This layer not only provides adhesion for the gold conductor stripes to underlying insulating layers but prevents the gold from diffusing through the tantalum layer and alloying with, for example, the silicon semiconductor material. This can be accomplished in a single deposition of tantalum in a nitrogen atmosphere without requiring any special or separate treatment of the tantalum film to provide barrier characteristics. At the same time, the tantalum-nitrogen layer is not subject to any alloying of tantalum and gold at processing temperatures.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:

a substrate of one conductivity;

at least one region of opposite conductivity to said substrate formed in said substrate and communicating with a surface of said substrate;

an insulating layer over the surface of said substrate having said region in said substrate communicating therewith, said insulating layer having an opening therein to provide a communication to said region;

a gold diffusion barrier layer of tantalum-nitrogen deposited on said insulating layer and extending into said opening for contact with said region;

a layer of gold deposited on said layer of tantalum-nitrogen and extending into said opening to make ohmic contact with said region through said layer of tantalum-nitrogen in said opening.

2. The semiconductor device of claim 1 in which a second layer of tantalum-nitrogen is deposited on said layer of gold.

3. A device according to claim 1 in which said substrate is silicon.

4. The device according to claim 3 in which said insulating layer is silicon dioxide.

5. The device according to claim 3 in which said insulating layer is silicon nitride.

* * * * *